(12) United States Patent  
Lee (10) Patent No.: US 7,919,853 B1  
(45) Date of Patent: Apr. 5, 2011

(54) SEMICONDUCTOR PACKAGE AND FABRICATION METHOD THEREOF

(75) Inventor: Ki Wook Lee, Seoul (KR)

(73) Assignee: Amkor Technology, Inc., Chandler, AZ (US)

( * ) Notice: Subject to any disclaimer, the term of this patent is extended or adjusted under 35 U.S.C. 154(b) by 221 days.

(21) Appl. No.: 11/933,908

(22) Filed: Nov. 1, 2007

(51) Int. Cl.
*H01L 23/10* (2006.01)
*H01L 23/34* (2006.01)

(52) U.S. Cl. ............... 257/706; 257/700; 257/E23.123

(58) Field of Classification Search .......... 257/667, 257/706, 700, E23.123
See application file for complete search history.

(56) References Cited

U.S. PATENT DOCUMENTS

| 5,801,435 A * | 9/1998 | Otsuki | 257/675 |
| 5,903,052 A * | 5/1999 | Chen et al. | 257/706 |
| 2004/0195685 A1 * | 10/2004 | Chiu et al. | 257/734 |

* cited by examiner

*Primary Examiner* — David A Zarneke
*Assistant Examiner* — Jenny L Wagner
(74) *Attorney, Agent, or Firm* — Weiss & Moy, P.C.

(57) ABSTRACT

A semiconductor package and method of manufacture has a substrate having an aperture. A semiconductor die is positioned in the aperture of the substrate and attached to a heat spreader by a first adhesive and electrically coupled to the substrate by at least one conductive wire. The heat spreader spans the aperture and is peripherally attached to a bottom surface of the substrate by a second adhesive. An encapsulant encapsulates the aperture, the semiconductor die, and the electrically conductive wire.

17 Claims, 12 Drawing Sheets

SEMICONDUCTOR PACKAGE AND FABRICATION METHOD THEREOF

FIELD OF THE INVENTION

The present invention relates to semiconductor package and, more specifically, to a semiconductor package that reduces cracking between a semiconductor die and a heat spreader

DESCRIPTION OF THE RELATED ART

In general, semiconductor package should be thin and have excellent thermal emission property. In some semiconductor packages, a semiconductor die is not positioned on the surface of a substrate but is positioned in an aperture formed on a substrate, thereby reducing the thickness of the semiconductor package. Thermal emission property improves by attaching a heat spreader on a bottom surface of the semiconductor package with an adhesive. Here, the heat spreader may be positioned in an aperture of the substrate or an aperture outside of the substrate. To improve thermal emission property of the semiconductor package, a heat spreader having a solder ball or a solder land is mounted on an external device.

However, the heat generated from the semiconductor die while the semiconductor package is mounted and operated on an external device may cause serious cracks between the semiconductor die and the heat spreader, or between the substrate and the heat spreader. That is, as there is a difference in coefficient of thermal expansion between the semiconductor die, the substrate, the adhesive, and the heat spreader, it may cause cracks to form at the interface of the semiconductor die and the heat spreader, or at the interface of the substrate and the heat spreader.

If such cracks do happen, heat is not being transferred from the semiconductor die to the heat spreader or from the substrate to the heat spreader, thereby deteriorating the electrical performance or stopping its function.

Furthermore, outside moisture may permeate into the crack. The moisture may turn into steam by the heat generated from the semiconductor die, thereby causing popcorn phenomenon.

Therefore, a need exists to provide a structure and method to overcome the above problems.

SUMMARY OF THE INVENTION

A semiconductor package and method of manufacture has a substrate having an aperture. A semiconductor die is positioned in the aperture of the substrate and attached to a heat spreader by a first adhesive and electrically coupled to the substrate by at least one conductive wire. The heat spreader spans the aperture and is peripherally attached to a bottom surface of the substrate by a second adhesive. An encapsulant encapsulates the aperture, the semiconductor die, and the electrically conductive wire.

The present invention will be more apparent from the following detailed description taken in conjunction with the accompanying drawings.

BRIEF DESCRIPTION OF THE DRAWINGS

Common reference numerals are used throughout the drawings and the detailed description to indicate the same elements.

DETAILED DESCRIPTION OF THE INVENTION

Figure 1:
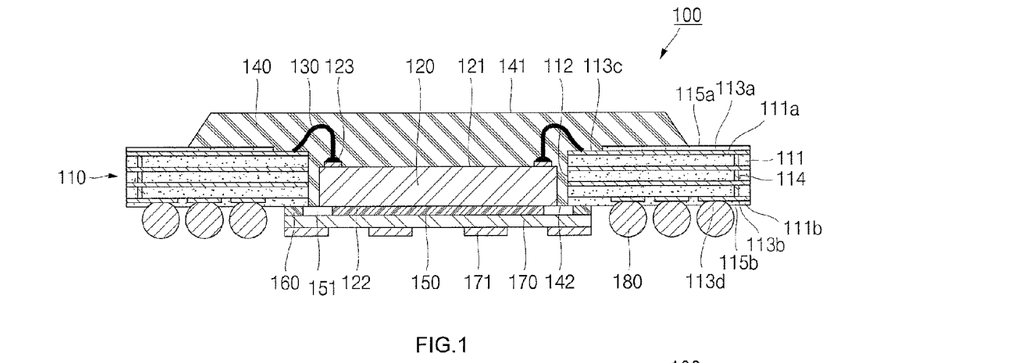
FIG. 1 is a cross-sectional view illustrating a semiconductor package according to one embodiment of the present invention.

Referring to FIG. 1, a semiconductor package 100 includes a substrate 110 having an aperture 112, a semiconductor die 120 positioned in the aperture 112 of the substrate 110, a plurality of electrically conductive wires 130 electrically coupling the substrate 110 and the semiconductor die 120, an encapsulant 140 encapsulating the aperture 112 of the substrate 110, the semiconductor die 120, and the electrically conductive wire 130, a first adhesive 150 adhered to the semiconductor die 120, a second adhesive 160 adhered to the substrate 110, a heat spreader 170 adhered to the first adhesive 150 and the second adhesive 160, and a plurality of solder balls 180 reflowed on the substrate 110.

The substrate 110 includes an insulation layer 111 having the aperture 112 formed in a middle area thereof. The insulation layer 111 includes an approximately planar first surface 111a and an approximately planar second surface 111b which is opposing the first surface 111a. The insulation layer 111 may be any one selected from polyimide, prepreg, and the equivalent thereof. However, the listing of materials is given as examples and is not limited thereto. A plurality of first electrically conductive patterns 113a may be formed on the first surface 111a of the insulation layer 111 and a plurality of second electrically conductive patterns 113b may be formed on the second surface 111b of the insulation layer 111. The first electrically conductive pattern 113a and the second electrically conductive pattern 113b may be any one selected from copper thin film and the equivalent, but the material thereof is not limited hereto. An electrically conductive via 114 may electrically couple the first electrically conductive pattern 113a and the second electrically conductive pattern 113b. Such an electrically conductive via 114 may be any one selected from copper and the equivalent, but the material is not limited hereto. A third electrically conductive pattern may further be formed in the insulation layer inside, and electrically conductive patterns having more layers may be formed according to the complexity of a semiconductor die 120. The first electrically conductive pattern 113a may be coated with the first cover coat 115a and the second electrically conductive pattern 113b may be coated with the second cover coat 115b. Here, the first cover coat 115a is not coated on the area of the first electrically conductive pattern 113a on which a electrically conductive wire 130 is bonded, and the second cover coat 115b is not coated on the area of the second electrically conductive pattern 113b on which solder balls 180 are reflowed.

The semiconductor die 120 is positioned inside the aperture 112 of the substrate 110. Since the width of the semiconductor die 120 is set to be smaller than that of the aperture 112, the semiconductor die 120 can be positioned inside the aperture 112 with ease. The semiconductor die 120 has a first surface 121 and an opposing second surface 122 which are both approximately planar. A plurality of bond pads 123 is formed on the first surface 121. Additionally, the second surface 122 of the semiconductor die 120 is approximately planar similar to the surface of the second cover coat 115b formed on the substrate 110.

The electrically conductive wire 130 electrically couples the substrate 110 and the semiconductor die 120. That is, the electrically conductive wire 130 electrically couples the first electrically conductive pattern 113a of the substrate 110 and the bond pad 123 of the semiconductor die 120. Such an electrically conductive wire 130 may be any one selected from Au wire, Cu wire, Al wire, and the equivalent thereof, but the material is not limited hereto.

The encapsulant 140 encapsulates the electrically conductive wire 130, the semiconductor die 120, and the aperture 112 of the substrate 110. Such an encapsulant 140 may be any one selected from epoxy molding compound, liquid sealant, and the equivalent thereof, but the material is not limited hereto. The encapsulant 140 includes an approximately planar first surface 141 which is formed on the upper part of the semiconductor die 120 and the electrically conductive wire 130, and an approximately planar second surface 142 which is opposing to the first surface 141 and forms the same surface with the second surface 122 on the circumference of the second surface 122 of the semiconductor die 120. Therefore, the second surface 122 of the semiconductor die 120 is exposed to the outside through the second surface 142 of the encapsulant 140.

The first adhesive 150 is adhered to the second surface 122 of the semiconductor die 120. The area of the first adhesive 150 may be smaller than that of the second surface 122 of the semiconductor die 120. In other words, the first adhesive 150 is not connected to the second adhesive 160 which means that there is a predetermined space 151 between them.

The first adhesive 150 may be any one selected from thermal adhesive, thermal grease which has excellent thermal conductivity, and the equivalent thereof. The first adhesive 150 has relatively low adhesion compared to the second adhesive 160, however, as its thermal conductivity is high, the first adhesive 150 may efficiently transfer the heat generated from the semiconductor die 120 to a heat spreader 170. Particularly, since the thermal grease has relatively high thermal conductivity and is a gel type, it has low stress characteristics. The first adhesive 150 plays a key role to emit heat of the semiconductor package 100 to the outside. That is, even if a big heat spreader 170 is mounted on the semiconductor die 120, the heat generated from the semiconductor die 120 may not be transferred to a heat spreader 170 when the first adhesive has low thermal conductivity, thereby failing the operation of the semiconductor die 120. Accordingly, one generally uses adhesive, thermal grease, and the equivalent thereof, which have excellent thermal conductivity for the first adhesive 150 in the present invention. The first adhesive 150 includes electrical and thermal conductive adhesive containing Au paste or Ag paste and thermal conductive adhesive containing ceramic paste. In the present invention, any sort of the first adhesive may be used. As the thicker the thickness of the first adhesive 150, the lower the thermal conductivity. Thus, one generally tries to minimize the thickness of the first adhesive 150.

The second adhesive 160 is adhered to the substrate of the circumference of the aperture 112. More specifically, the second adhesive 160 is adhered on the surface of the second cover coat 115b of the aperture circumference 112. The second adhesive 160 is not to be coupled to the first adhesive 150. So, the second surface 142 of the encapsulant 140 is being exposed between the first adhesive 150 and the second adhesive 160 to form a predetermined space 151. The predetermined space 151 is to absorb and eliminate thermal stress of the semiconductor package 100. And, the second adhesive 160 is a curved line and may have a separated or a cut shape. As the second adhesive 160 is being separated or cut, it absorbs stress efficiently by the difference in coefficient thermal expansion. The second adhesive 160 may be separated into more numbers thereof, but the numbers thereof is not limited hereto.

The second adhesive 160 has relatively low thermal conductivity compared to the first adhesive 150, but has excellent adhesion, thereby reducing interface crack due to the difference in coefficient thermal expansion. That is, the substrate 110, the semiconductor die 120, the encapsulant 140, and the heat spreader 170 may be expanded thermally because of the heat supplied from outside and generated from the semiconductor die 120. There could be interface crack between the substrate 110 and the second adhesive 160, or between the second adhesive 160 and the heat spreader 170 due to the difference in coefficient thermal expansion of respective components. However, the second adhesive 160 has relatively high adhesion, and such interface crack rarely occur. And, there could be no interface crack to occur between the first adhesive 150 and the semiconductor die 120, and between the first adhesive 150 and the heat spreader thanks to the characteristics of the second adhesive 160. Accordingly, as there is no gap between the first adhesive 150 and the semiconductor die 120, and between the first adhesive 150 and the heat spreader 170, the heat from the semiconductor die 120 is being transferred efficiently the heat spreader 170 through the first adhesive 150.

The heat spreader 170 is adhered to the first adhesive 150 and the second adhesive 160. Such a heat spreader 170 may be any one selected from aluminum (Al), copper (Cu), and the equivalent thereof, but the material is not limited hereto. The thicker the heat spreader 170, the higher radiation property, but the heat spreader 170 is not being protruded over the lower part of solder balls 180.

The solder ball 180 is reflowed on the second electrically conductive pattern 113b formed on the substrate 110. In addition to electrically connecting the semiconductor die 120 and an external device (not shown), the solder ball 180 fixes the semiconductor die 120 to an external device. Such a solder ball 180 may be Sn/Pb, leadless solder, and the equivalent thereof, but the material is not limited hereto. The solder ball 180 described in drawings is round shape, but it may be a flat type. A flat type solder ball is called a solder land.

In the present invention, a solder 171 may be reflowed on the heat spreader 170 in order to emit heat from the heat spreader 170 through an external device. Such a solder 171 may be partially reflowed on the heat spreader 170 or reflowed as a whole, but the area of the solder to be reflowed is not limited hereto.

Figure 2A:
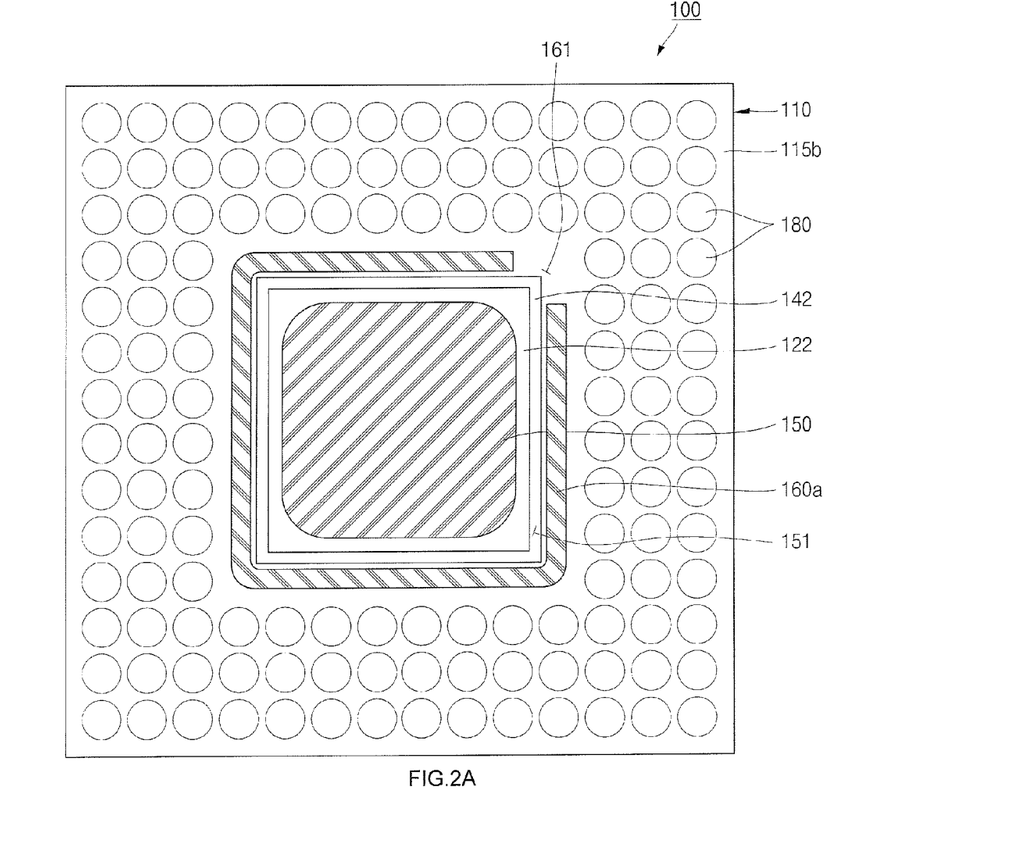
FIG. 2A-FIG. 2D are bottom views illustrating the state before a heat spreader is adhered to a semiconductor package of FIG. 1.

Referring to FIG. 2A, the second adhesive 160a may be a square-shaped frame having an open region 161 on the substrate 110. That is, the second adhesive 160a is a square frame having four corners and of them, one corner is open or cut so as to have the open region 161. Since the second adhesive 160 has the open region 161, it absorbs stress efficiently by the difference in coefficient thermal expansion itself. Moreover, the open region 161 plays a role in ejecting to outside the various kinds of gas which may be generated during the curing step of the first adhesive 150 and the second adhesive 160a. Therefore, in the space 151, the gas is not compacted and the gas is altogether ejected to outside. In that way, the space 151 becomes in the state like the atmospheric pressure. In addition, the air in the space 151 may be heated and expanded due to the heat supplied from the outside or the semiconductor die itself. In this way, the expanded air may cause the pop corn phenomenon and it may damage the semiconductor package. However, as described above, since the open region 161 is formed in the second adhesive 160a, the heated air is rapidly exhausted to the outside. Therefore, the pop corn phenomenon of the semiconductor package is prevented. In addition, the separation of the heat spreader from the semiconductor die and the substrate is prevented.

Figure 2B:
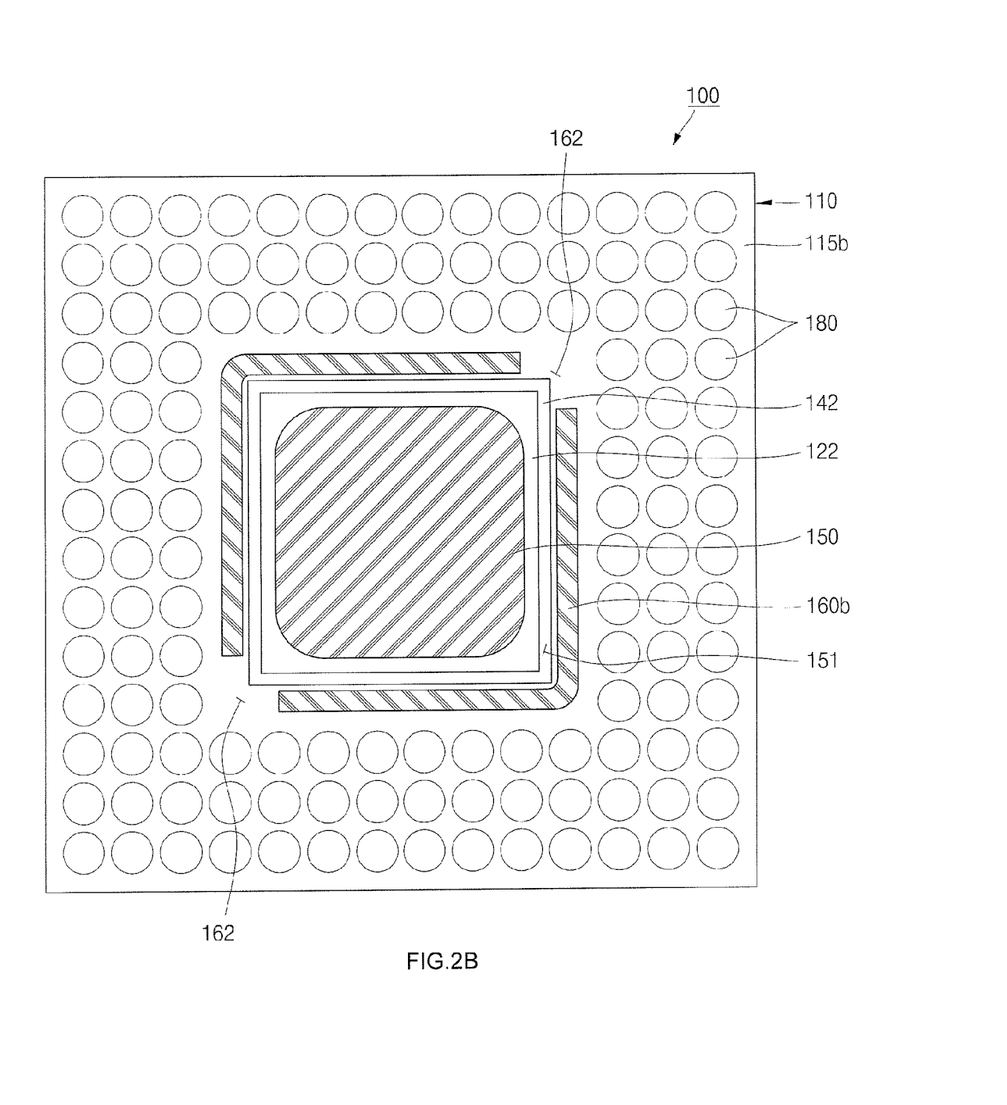

Referring to FIG. 2B, the second adhesive 160b may be formed with two "L" shape frames that are facing each other. That is, the second adhesive 160b is a square-shaped frame and two corners mutually corresponding in a diagonal direction are open or cut so as to have two open regions 162, respectively. As described above, since the second adhesive 160b has two open regions 162, it absorbs stress more efficiently by the difference in coefficient thermal expansion. Moreover, two open regions 162 more actively prevents the pop corn phenomenon of the semiconductor package and separation of the heat spreader.

Figure 2C:
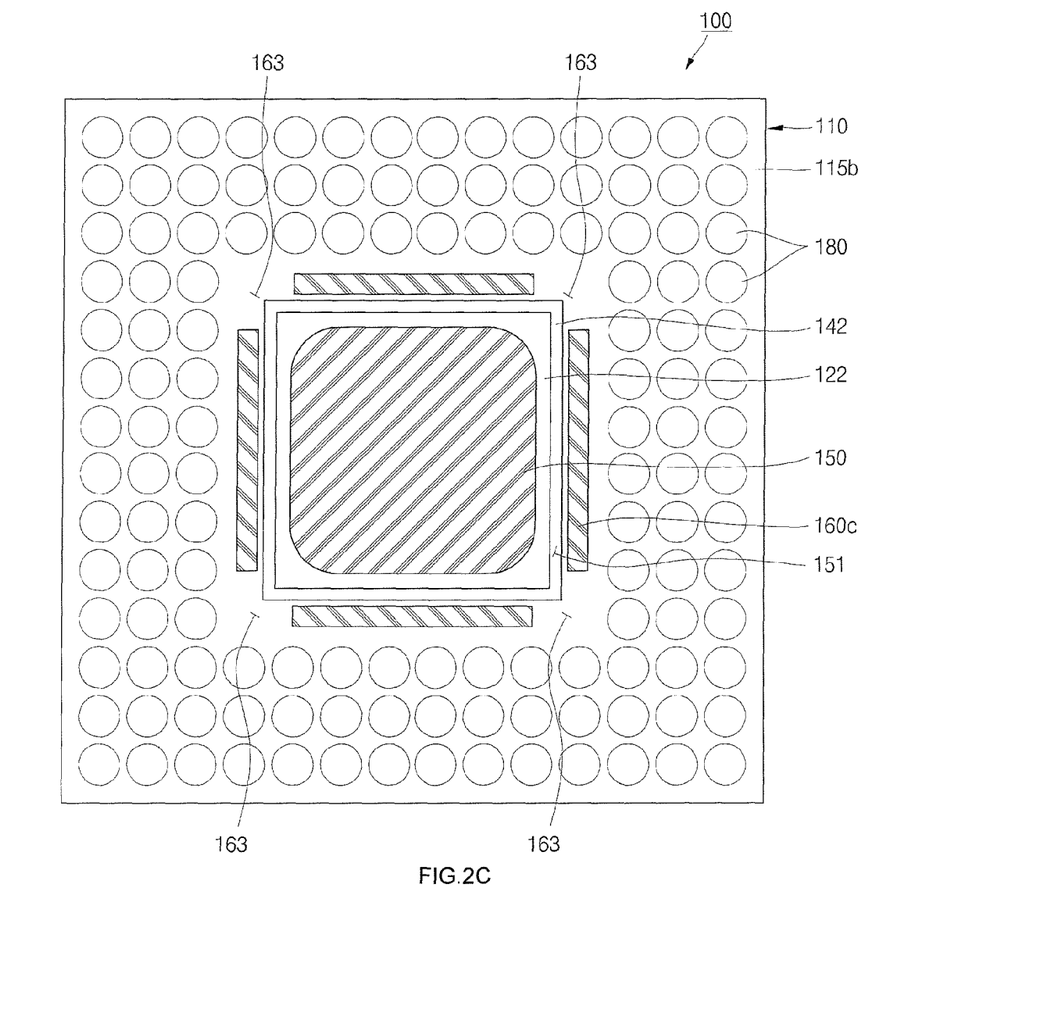

Referring to 2C, the second adhesive 160c may be formed of four "-" shape frames. That is, the second adhesive 160c is a square-shaped frame and four corners are open or cut so as to have four open regions 163, respectively.

Figure 2D:
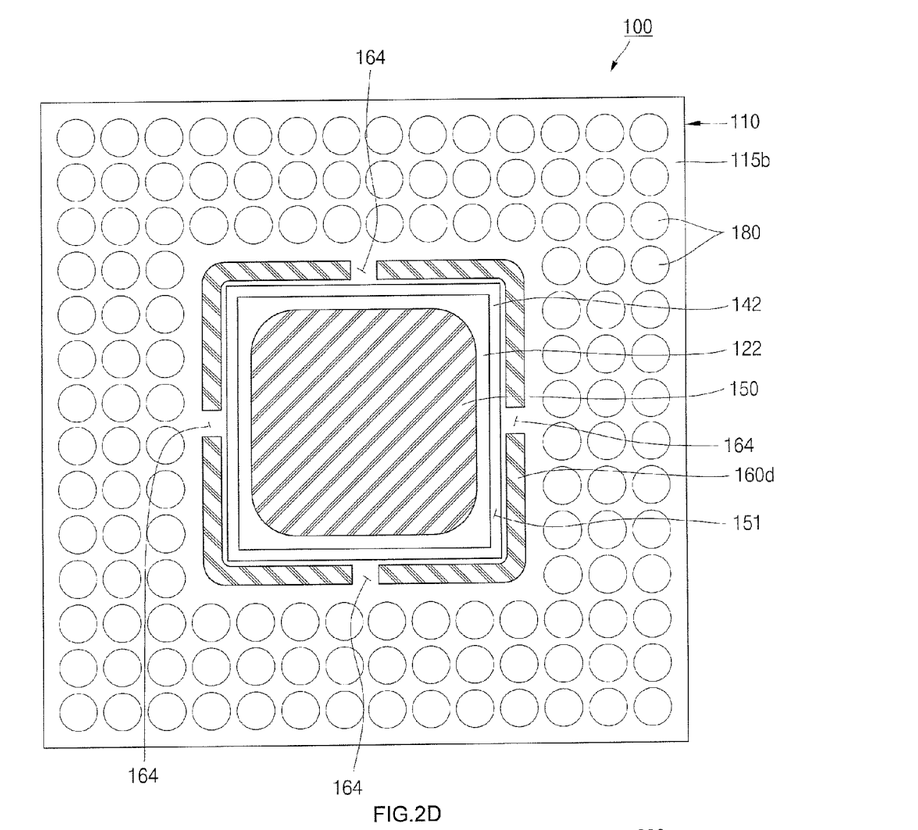

Referring to 2D, the second adhesive 160d may be a square-shaped frame having the middle of the respective side open or cut. That is, the second adhesive 160d is a square-shaped frame and the middle of four sides is respectively open or cut so as to have four open regions 164.

Figure 3:
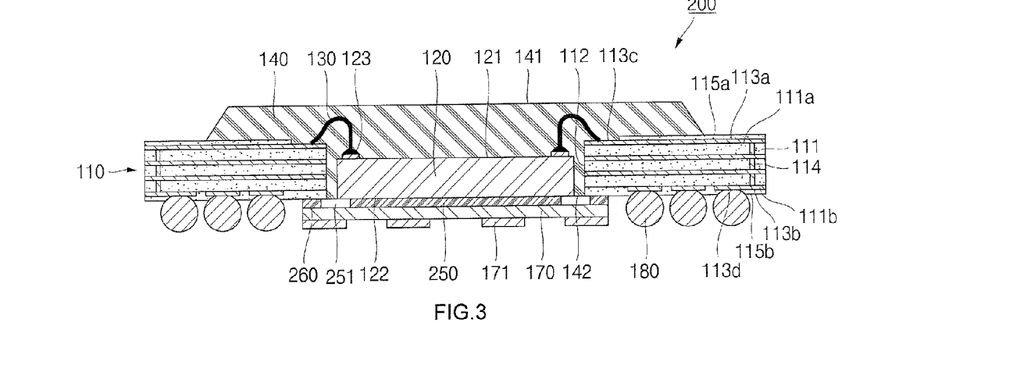
FIG. 3 is a cross-sectional view illustrating a semiconductor package according to another embodiment of the present invention.

Referring to FIG. 3, a semiconductor package 200 according to another embodiment of the present invention and similar to the semiconductor package 200 described above is shown. The semiconductor package 200 has a first adhesive 250 and a second adhesive 260 which are formed of the same material. For instance, the first adhesive 250 and the second adhesive 260 may have excellent thermal conductivity. The first adhesive 250 and the second adhesive 260 has relatively small adhesion but may have excellent thermal conductivity. Therefore, a semiconductor package 200 employing the first adhesive 250 and the second adhesive 260 has a semiconductor die 120 with high thermal conductivity. The first adhesive 250 and the second adhesive 260 has the same shape as described above. That is, the first adhesive 250 is attached to the second surface of the semiconductor die 120, and the second adhesive 260 may be formed on the second cover coat 115b of the substrate 110 at a form of at least two straight lines separated. There will be a predetermined space 251 between the first adhesive 250 and the second adhesive 260.

Figure 4A:
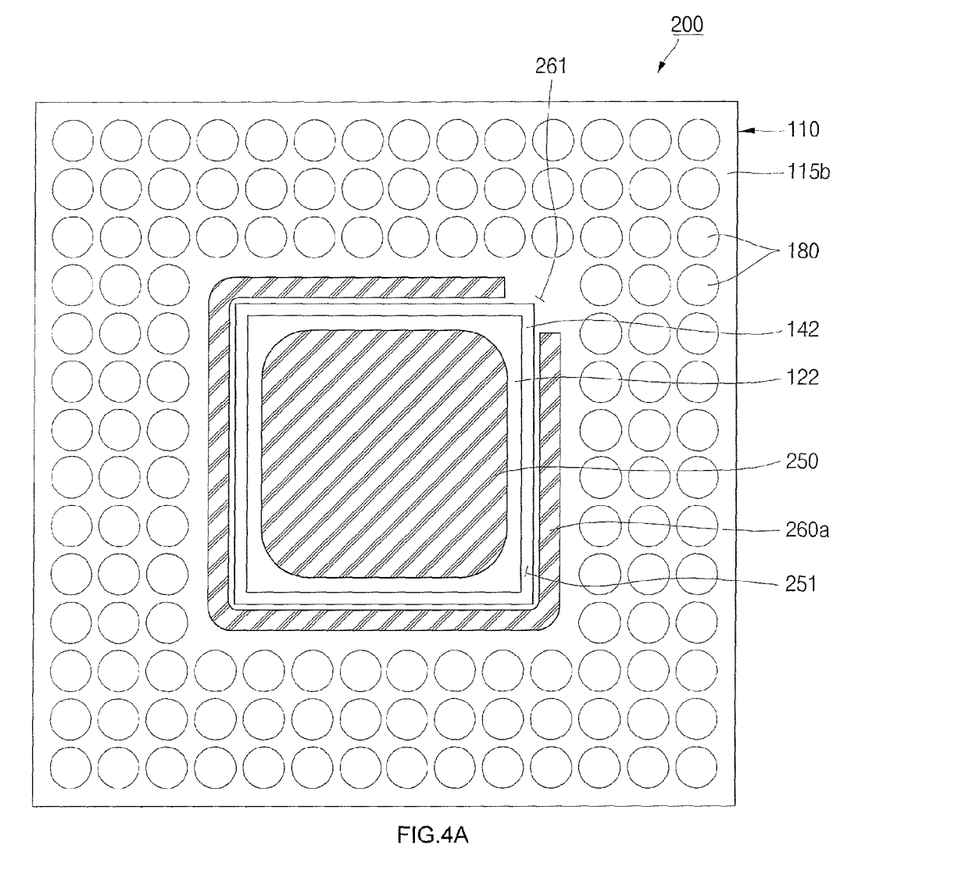
FIG. 4A-FIG. 4D are bottom views illustrating the state before a heat spreader is adhered to a semiconductor package of FIG. 3.

Referring to 4A, the second adhesive 260a may be a square-shaped frame having one corner open. That is, the second adhesive 260a is a square frame having four corners and of them, one corner is open or cut so as to have open region 261.

Figure 4B:
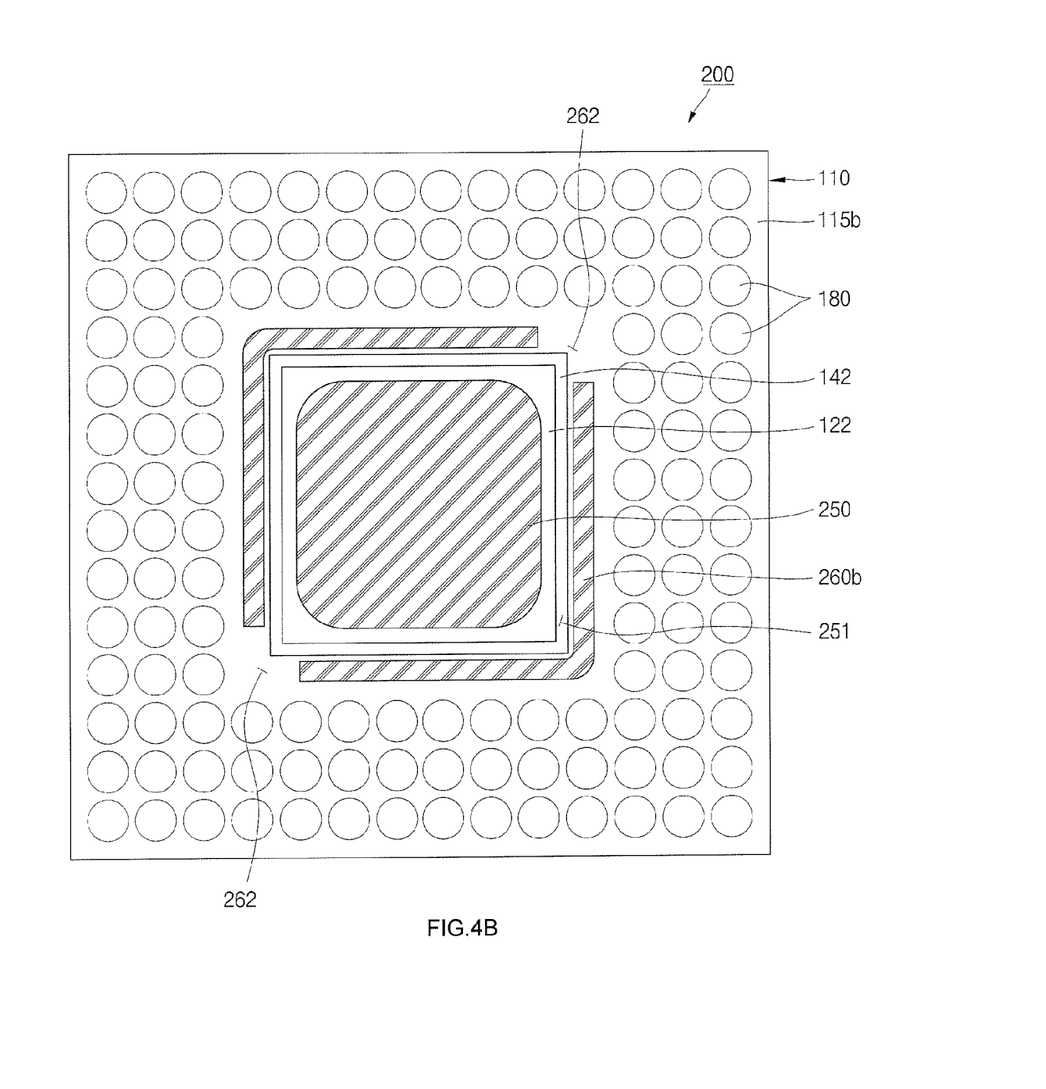

Referring to FIG. 4B, the second adhesive 260b may be formed with two "L" shape frames that are facing each other. That is, the second adhesive 260b is a square-shaped frame and two corners mutually corresponding in a diagonal direction are open or cut so as to have two open regions 262, respectively.

Figure 4C:
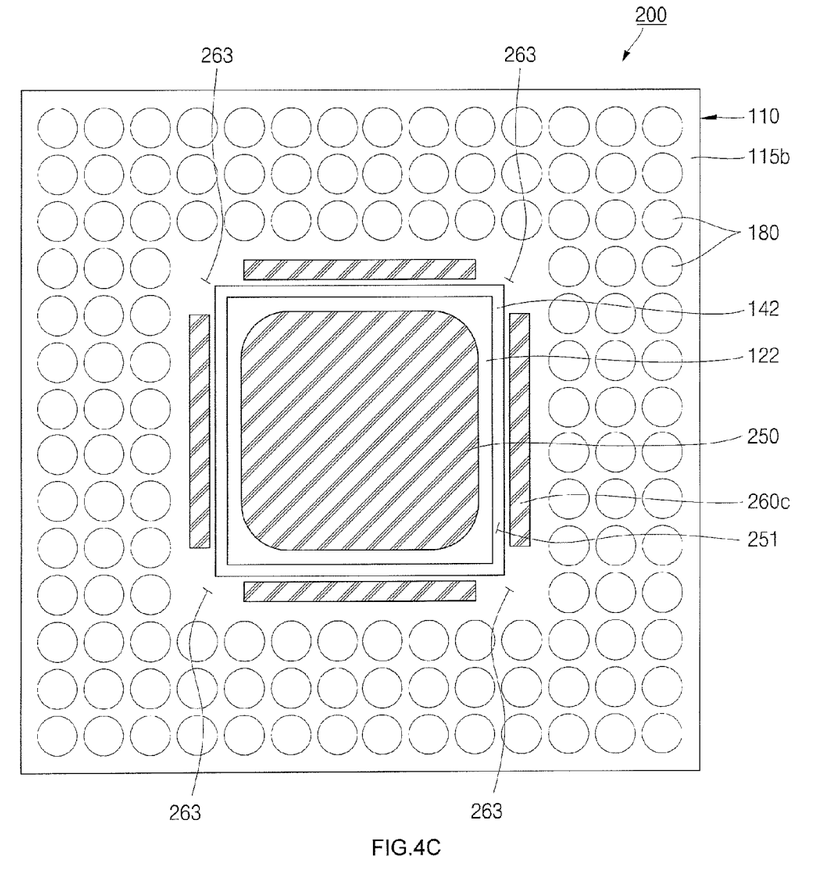

Referring to 4C, the second adhesive 260c may be formed of four "-" shape frames. That is, the second adhesive 260c is a square-shaped frame and four corners are open or cut so as to have four open regions 263, respectively.

Figure 4D:
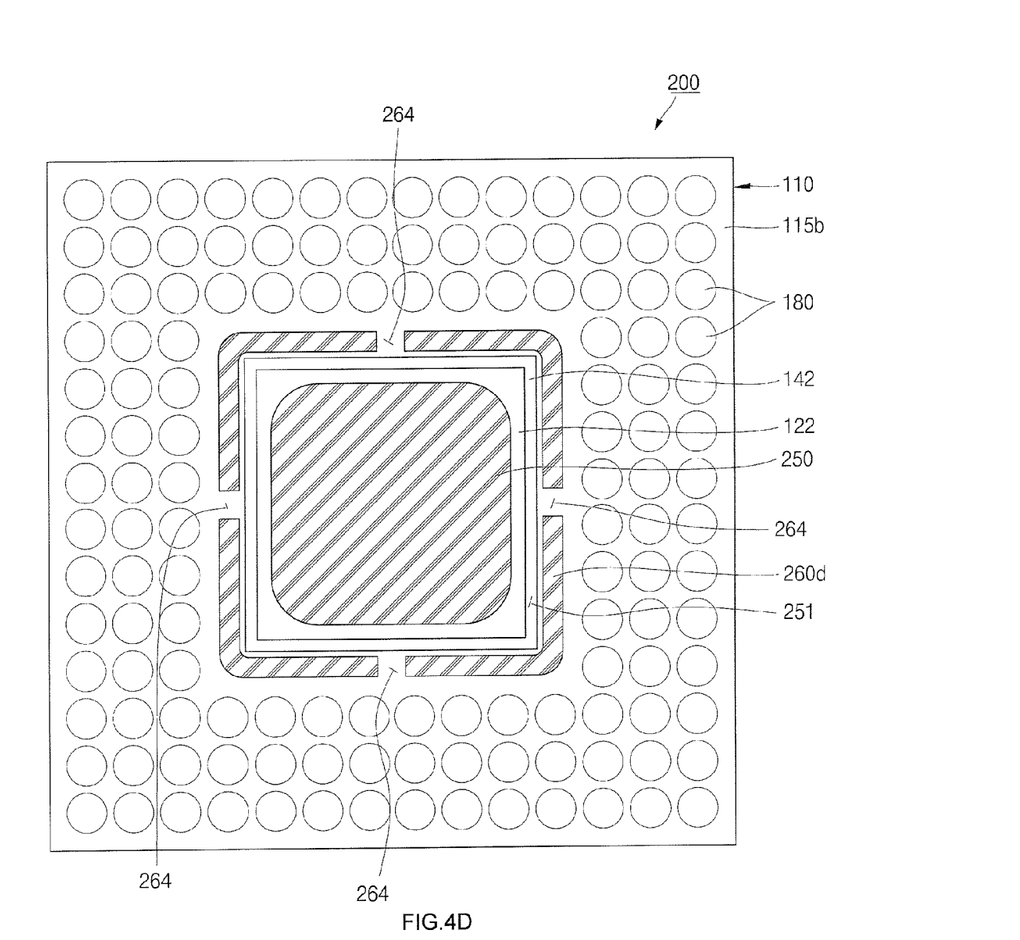

Referring to 4D, the second adhesive 260d may be a square-shaped frame having the middle of the respective side open or cut. That is, the second adhesive 260d is a square-shaped frame and the middle of four sides is respectively open or cut so as to have four open regions 264.

Figure 5A:
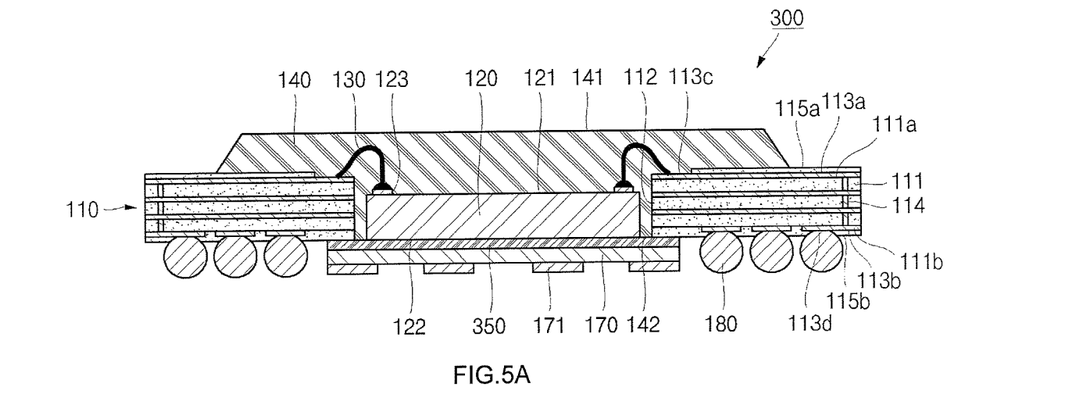
FIG. 5A is a cross-sectional view illustrating a semiconductor package according to another embodiment of the present invention.
Figure 5B:
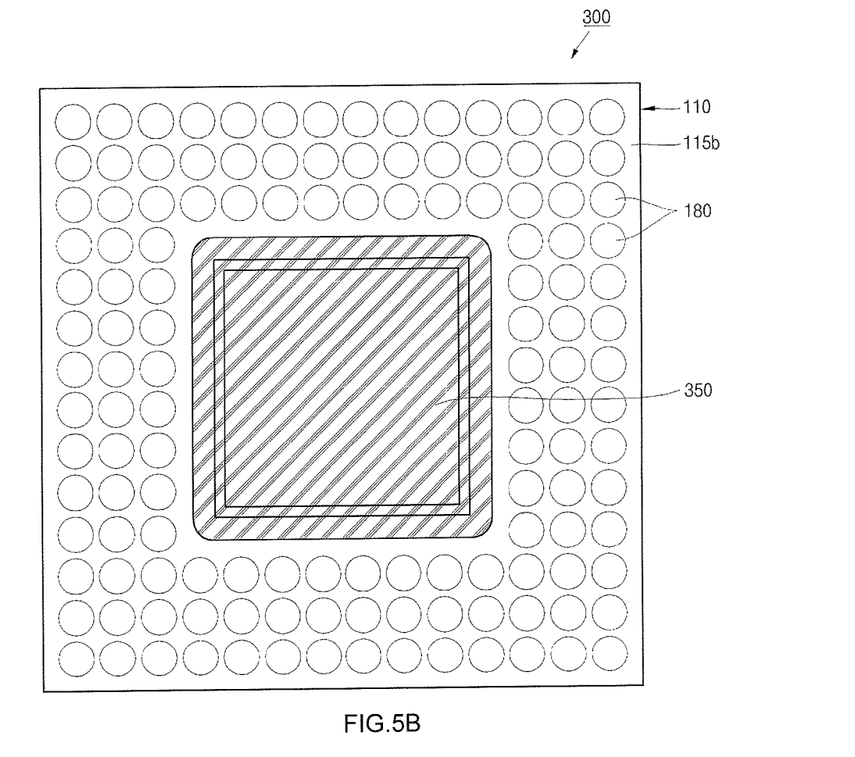
FIG. 5B is a bottom view illustrating a semiconductor package to which a heat spreader is not adhered.

Referring to FIGS. 5A and 5B, a semiconductor package 300 according to another embodiment of the present invention and similar to the semiconductor package 200 described above is shown. The semiconductor package 300 may have a first adhesive connected to a second adhesive 350. In other words, the first adhesive and the second adhesive 350 formed of the same material are connected to each other. Therefore, the first adhesive and the second adhesive 350 are attached to the second surface 122 of the semiconductor die 120, the second cover coat 115b of the substrate 110, and the second surface 142 of the encapsulant 140. And, the first adhesive and the second adhesive 350 which are mutually connected may have excellent thermal conductivity. Accordingly, the semiconductor package 300 employing the first adhesive and the second adhesive 350 has a semiconductor die 120 with high thermal conductivity.

Referring to FIG. 6A to FIG. 6H, a fabricating method of a semiconductor package is illustrated according to one embodiment of the present invention. As illustrated, a fabricating method of a semiconductor package includes steps of preparing substrate, closing aperture of substrate, positioning semiconductor die, wire bonding, encapsulating, eliminating tape, adhearing heat spreader, and reflowing solder ball.

Figure 6A:
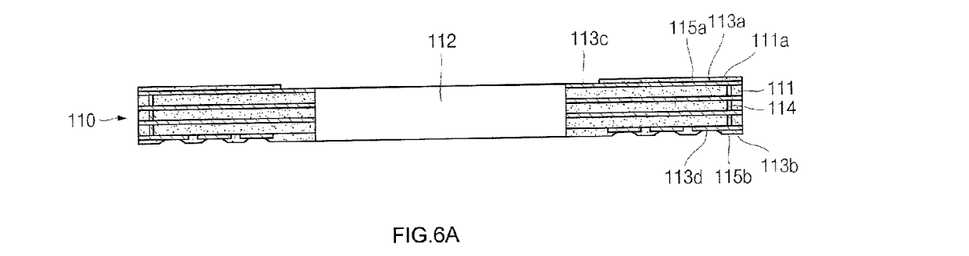
FIG. 6A-FIG. 6H are cross-sectional views in sequence for illustrating fabricating method of a semiconductor package according to one embodiment of the present invention.

As illustrated in FIG. 6A, a substrate 110 having an aperture 112 formed in the middle thereof is provided. More specifically, the substrate 110 includes: an insulation layer 111 having an aperture 112 formed in the middle thereof, the first electrically conductive pattern 113a which is formed on the upper side of the insulation layer 111, the second electrically conductive pattern 113b which is formed on the lower side of the insulation layer 111, the first cover coat 115a covering the first electrically conductive pattern 113a, and the second cover coat 115b covering the second electrically conductive pattern 113b. The first cover coat 115a is not coated on the area 113c of the first electrically conductive pattern 113a on which wire is being bonded later, and the second cover coat 115b is not formed on the area of the first electrically conductive pattern 113a on which solder balls 180 are being reflowed later. The first electrically conductive pattern 113a may be electrically connected to the second electrically conductive pattern 113b by the electrically conductive via 114. Additionally, the third electrically conductive pattern may further be formed inside the insulation layer 111 and conductive patterns of several layers may be further formed.

Figure 6B:
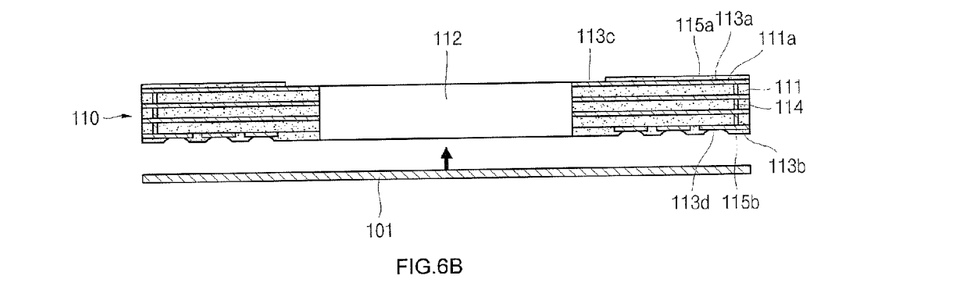

As illustrated in FIG. 6B, during closing of the aperture 112 of the substrate 110, a tape 101 of a predetermined width closes the aperture 112 of the substrate 110. That is, the tape 101 closes the lower part of the aperture 112. Such a tape 101 may be any one selected from insulating tape, ultraviolet tape, and the equivalent thereof, but the material is not limited hereto.

Figure 6C:
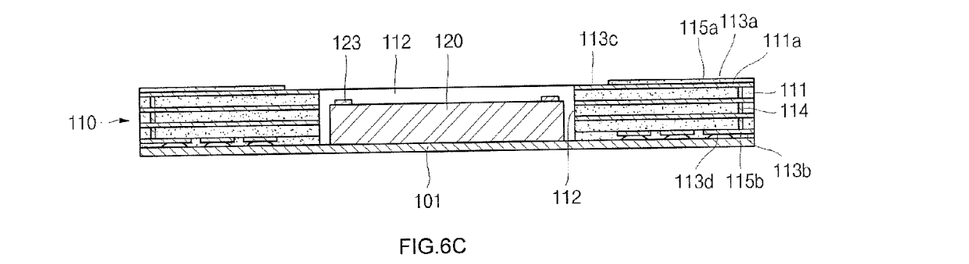

As illustrated in FIG. 6C, during positioning of the semiconductor die 120, the semiconductor die 120 is being positioned inside the aperture 112 of the substrate 110, which is the upper part of the tape 101. The semiconductor die 120 will be fixed on the tape 101 due to adhesive property of the tape 101. A plurality of bond pads 123 is formed on the semiconductor die 120.

Figure 6D:
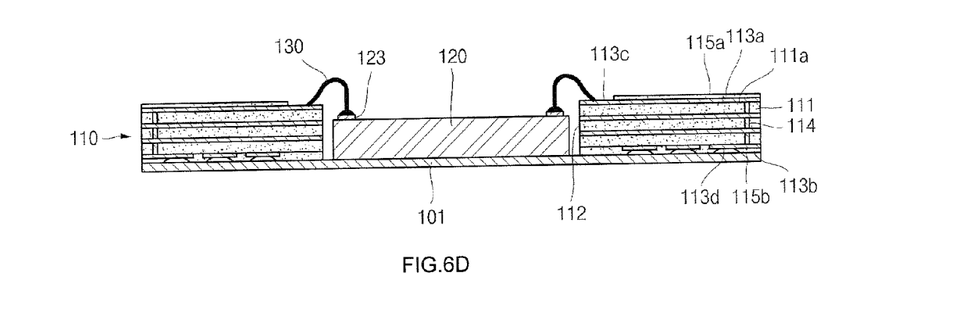

As illustrated in FIG. 6D, during bonding the wire 130, the semiconductor die 120 is electrically coupled to the substrate 110. That is, the electrically conductive wire 130 electrically couples a bond pad 123 of the semiconductor die 120 and the first electrically conductive pattern 113a of the substrate 110. This process can be automatically performed by a wire bonder. The electrically conductive wire 130 may be any one selected from gold wire, copper wire, aluminum wire, and the equivalent thereof, but the material is not limited hereto.

Figure 6E:
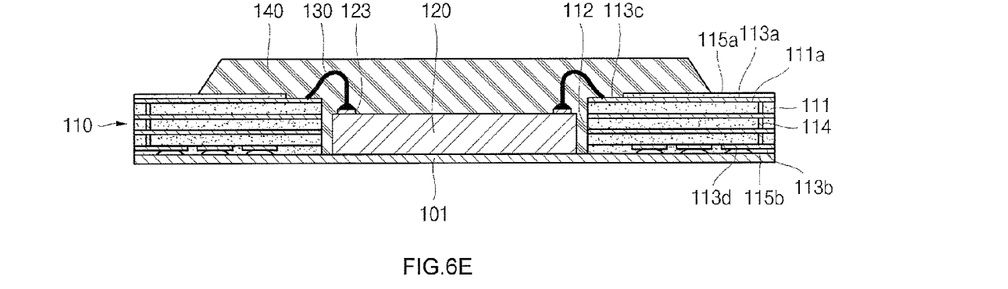

As illustrated in FIG. 6E, during encapsulating, an encapsulant 140 encapsulates the aperture 112 of the substrate 110, the semiconductor die 120, and the electrically conductive wire 130. At this time, as a tape 101 is adhered in advance to the lower part of the aperture 112 formed on the substrate 110, the lower side of the semiconductor die 120 is not encapsulated by the encapsulant 140.

Figure 6F:
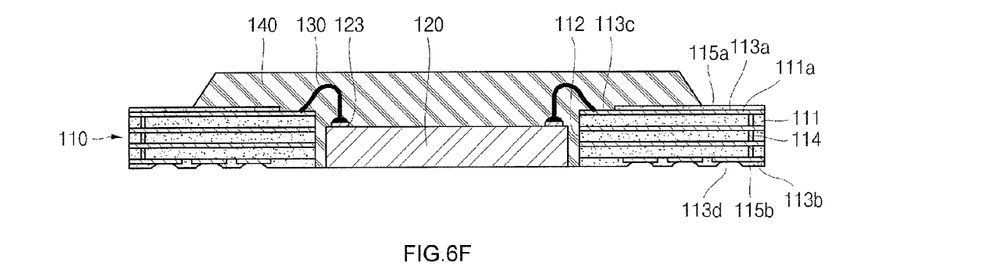

As illustrated in FIG. 6F, when eliminating the tape 101, the tape 101 is separated from the substrate 110. The tape 101 may be removed from the substrate 110 mechanically, or be removed from the substrate 110 by applying ultraviolet radiation or heat. The above are given as examples and should not be seen as to limit the scope of the present invention.

Figure 6G:
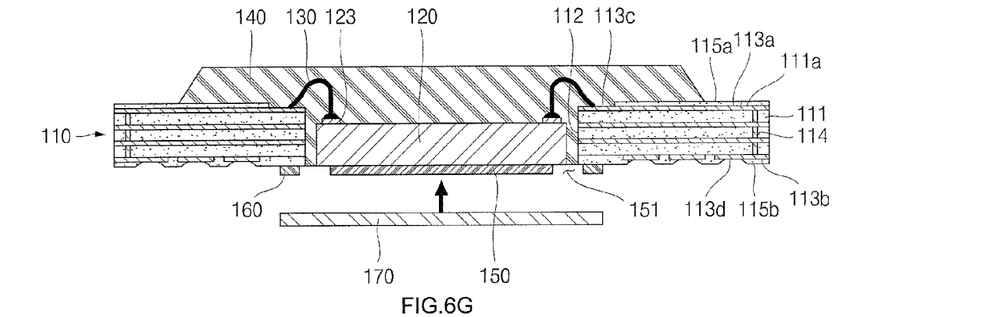

As illustrated in FIG. 6G, during adhering of the heat spreader 170, the heat spreader 170 is adhered to the semiconductor die 120 and the substrate 110 after interposing the first adhesive 150 and the second adhesive 160. Here, the first adhesive 150 and the second adhesive 160 may be adhered in advance to the semiconductor die 120 and the substrate 110. That is, after adhering the first adhesive 150 and the second adhesive 160 to the semiconductor die 120 and the substrate 110 respectively, a heat spreader 170 may be attached to the first adhesive 150 and the second adhesive 160. The first adhesive 150 and the second adhesive 160 may be attached in advance to the heat spreader 170. That is, after attaching the first adhesive 150 and the second adhesive 160 to the heat spreader 170 in advance, the semiconductor die 120 and the substrate 110 may be attached to it. And, a predetermined space 151 may be formed between the first adhesive 150 and the second adhesive 160. That is, the first adhesive 150 and the second adhesive 160 may not be formed on the encapsulant 140 interposed between the semiconductor die 120 and the substrate 110. Additionally, the first adhesive 150 may be any one selected from thermal adhesive, thermal grease, and the equivalent thereof that have relatively high thermal conductivity, and the second adhesive 160 may have relatively high adhesion. Therefore, heat of the semiconductor die 120 is emitted to the heat spreader 170 through the first adhesive 150, and the second adhesive 160 prevents interface crack from occurring.

Figure 6H:
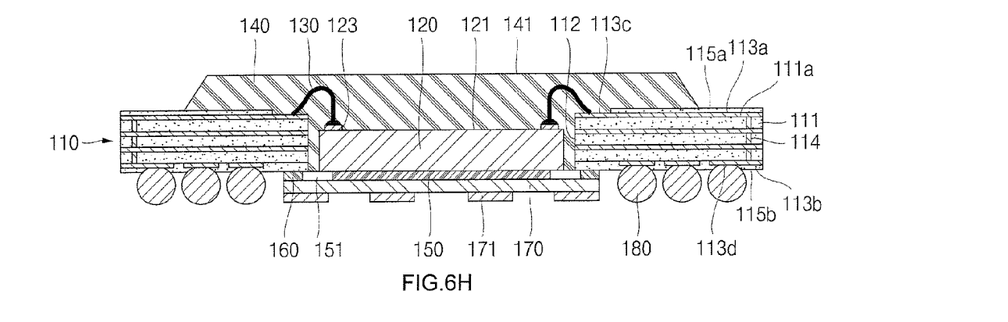

As illustrated in FIG. 6H, a plurality of solder balls 180 are reflowed to the substrate 110. That is, a solder ball 180 is being reflowed to the second electrically conductive pattern 113b formed on the substrate 110. At this time, a plurality of solders 171 may be formed on the surface of the heat spreader 170 in order to improve thermal emission property.

Figure 7A:
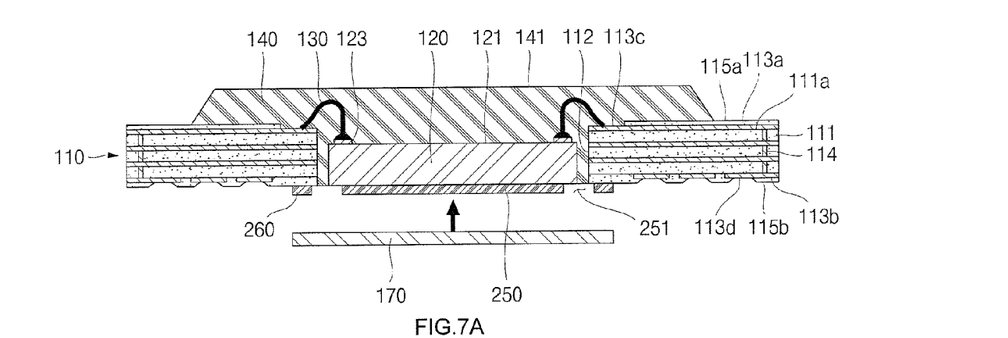
FIG. 7A-FIG. 7B are cross-sectional views illustrating fabricating method of a semiconductor package according to another embodiment of the present invention.

Referring to FIGS. 7A and 7B, a fabricating method of a semiconductor package is illustrated according to another embodiment of the present invention. As illustrated in FIG. 7A, according to a fabricating method of a semiconductor package of the present invention, a first adhesive 250 and a second adhesive 260 are formed of the same material. That is, both the first adhesive 250 and the second adhesive 260 are any one selected from thermal adhesive and the equivalent thereof. The first adhesive 250 may be interposed between the semiconductor die 120 and the heat spreader 170, and the second adhesive 260 may be interposed between the substrate 110 and the heat spreader 170.

Figure 7B:
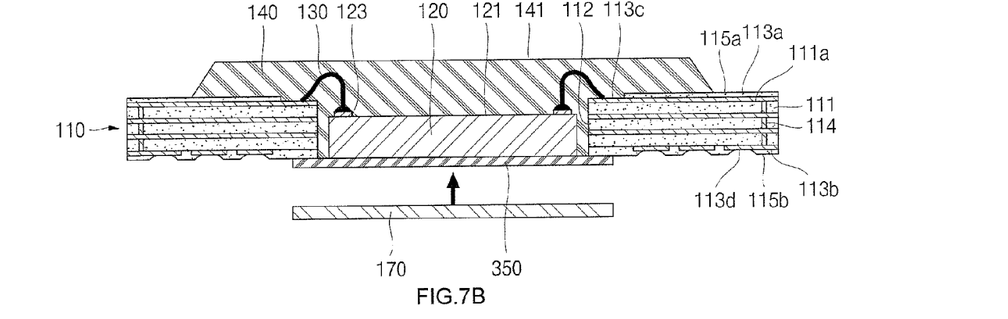

As illustrated in FIG. 7B, according to a fabricating method of a semiconductor package of the present invention, a first adhesive and a second adhesive 350 are formed of the same material and may be mutually coupled. That is, the first adhesive and the second adhesive 350 may be any one selected from thermal adhesive and the equivalent thereof, and be mutually coupled. Therefore, the first adhesive and the second adhesive 350 formed of the same material may be interposed between the semiconductor die 120 and the heat spreader 170, between the encapsulant 140 and the heat spreader 170, and between the substrate 110 and the heat spreader 170.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process, may be implemented by one skilled in the art in view of this disclosure.

What is claimed is:

1. A semiconductor package, comprising:
   a substrate having an insulative layer having a first surface and a second surface, an aperture formed through the insulative layer of the substrate, conductive patterns formed on the first surface and the second surface of the insulative layer;
   a semiconductor die having a first surface and a second surface positioned in the aperture of the insulative layer of the substrate, the semiconductor device electrically coupled to the conductive patterns formed on the first surface of the insulative layer;
   a heat spreader having a first surface and a second surface, the second surface of the semiconductor die attached to a first surface of the heat spreader by a first adhesive, wherein the heat spreader spans the aperture and is peripherally attached to the second surface of the substrate by a second adhesive;
   at least one solder contact formed on a second surface of the heat spreader to emit heat from the heat spreader to an external device;
   an encapsulant encapsulates the aperture, the semiconductor die, and the electrically conductive wire; and
   an opening formed between the first adhesive and the second adhesive and between an exposed portion of the encapsulant and the heat spreader.

2. A semiconductor package in accordance with claim 1, wherein the first adhesive has a high thermal conductivity, and the second adhesive has a high adhesion.

3. A semiconductor package in accordance with claim 1, wherein a thermal conductivity of the first adhesive is higher than a thermal conductivity of the second adhesive.

4. A semiconductor package in accordance claim 1, wherein adhesion of the first adhesive is lower than adhesion of the second adhesive, the second adhesive having a higher adhesion to reduce interface cracking due to differences in coefficients of thermal expansion.

5. A semiconductor package in accordance with claim 1, wherein the first adhesive and the second adhesive are thermal adhesive.

6. A semiconductor package in accordance with claim 1, wherein a width of the first adhesive is shorter than a width of the second surface of the semiconductor die.

7. A semiconductor package in accordance with claim 1, further comprising at least one contact coupled to the conductive patterns formed on the second surface of the insulative layer.

8. A semiconductor package, comprising:
   a substrate having an insulative layer, a plurality of conductive patterns formed on a first surface and a second surface of the insulative layer, an aperture formed through the substrate;
   a semiconductor die having a first surface and a second surface positioned in the aperture of the substrate and electrically coupled to the conductive patterns formed on the first surface of the insulative layer by at least one conductive wire;
   a heat spreader spanning the aperture;
   means for attaching the heat spreader to the second surface of the semiconductor die;
   means for attaching the heat spreader to a bottom surface of the substrate; and
   an encapsulant encapsulates the aperture, the semiconductor die, and the electrically conductive wire;
   wherein an opening is formed between the means for attaching the heat spreader to the second surface of the semiconductor die and the means for attaching the heat spreader to the bottom surface of the substrate and between an exposed portion of the encapsulant and the heat spreader.

9. A semiconductor package in accordance with claim 8, wherein the means for attaching the heat spreader to the semiconductor die has a high thermal conductivity, and the means for attaching the heat spreader to the bottom surface of the substrate has a high adhesion.

10. A semiconductor package in accordance with claim 8, wherein a thermal conductivity of the means for attaching the heat spreader to the semiconductor die is higher than a thermal conductivity of the means for attaching the heat spreader to the bottom second surface of the substrate.

11. A semiconductor package, comprising:
   a substrate having an insulative layer, a plurality of conductive patterns formed on a first surface and a second surface of the insulative layer, an aperture formed through the substrate;
   a semiconductor die having a first surface and a second surface positioned in the aperture of the substrate and electrically coupled to at least one of the conductive patterns formed on the first surface of the insulative layer by at least one conductive wire;
   a heat spreader attached to the second surface of the semiconductor device by a first adhesive, wherein the heat spreader spans the aperture and is peripherally attached to a bottom surface of the substrate by a second adhesive having at least one open region;
   an encapsulant encapsulates the aperture, the semiconductor die, and the electrically conductive wire; and
   an opening formed between the first adhesive and the second adhesive and between an exposed portion of the encapsulant and second surface of the semiconductor die and the heat spreader.

12. A semiconductor package in accordance with claim 11, wherein a thermal conductivity of the first adhesive is higher than a thermal conductivity of the second adhesive.

13. A semiconductor package in accordance claim 11, wherein adhesion of the first adhesive is lower than adhesion of the second adhesive.

14. A semiconductor package in accordance claim 11, wherein adhesion of the first adhesive is lower than adhesion of the second adhesive.

15. A semiconductor package in accordance with claim 11, wherein the first adhesive and the second adhesive are thermal adhesive.

16. A semiconductor package in accordance with claim 11, wherein a width of the first adhesive is shorter than a width of the second surface of the semiconductor die.

17. A semiconductor package in accordance with claim 11, further comprising at least one solder formed on a lower surface of the heat spreader.

* * * * *